United States Patent
Xu et al.

(10) Patent No.: US 10,050,410 B2
(45) Date of Patent: Aug. 14, 2018

(54) COEFFICIENT OF THERMAL EXPANSION (CTE) MATCHED TRANSISTOR OUTLINE (TO) HEADER

(71) Applicant: Lumentum Operations LLC, Milpitas, CA (US)

(72) Inventors: Jack Xu, Milpitas, CA (US); Yonghong Guo, Union City, CA (US); Nicolas Guerin, San Jose, CA (US); Lihua Wang, San Jose, CA (US); Yaogeng Ding, Foster City, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/433,747

(22) Filed: Feb. 15, 2017

(65) Prior Publication Data

US 2018/0069371 A1   Mar. 8, 2018

Related U.S. Application Data

(60) Provisional application No. 62/383,244, filed on Sep. 2, 2016.

(51) Int. Cl.
*H01S 5/022* (2006.01)

(52) U.S. Cl.
CPC .................. *H01S 5/02212* (2013.01)

(58) Field of Classification Search
CPC .................................. H01S 5/02212
See application file for complete search history.

(56) References Cited

U.S. PATENT DOCUMENTS

| | | | |
|---|---|---|---|
| 7,073,958 B2 | 7/2006 | Oomori | |
| 2002/0051268 A1* | 5/2002 | Tonehira | G02B 6/4206 398/135 |
| 2015/0043166 A1* | 2/2015 | Heo | H04B 10/503 361/704 |
| 2017/0294390 A1* | 10/2017 | Hettler | H01L 23/041 |

* cited by examiner

*Primary Examiner* — Dung Nguyen
(74) *Attorney, Agent, or Firm* — Harrity & Harrity, LLP (57) ABSTRACT

A transistor outline (TO) package may include a TO cap. The TO package may include a TO header. The TO header may include a header stem of a first material and a first coefficient of thermal expansion (CTE) value. The TO header may include a header base of a second material and a second CTE value. The first material and the second material may be different. The first CTE value and the second CTE value may be different. The first CTE value and the second CTE value may be within a threshold percentage of each other.

20 Claims, 6 Drawing Sheets

COEFFICIENT OF THERMAL EXPANSION (CTE) MATCHED TRANSISTOR OUTLINE (TO) HEADER

RELATED APPLICATION(S)

This application claims priority under 35 U.S.C. § 119 to U.S. Provisional Patent Application No. 62/383,244, filed on Sep. 2, 2016, the content of which is incorporated by reference herein in its entirety.

TECHNICAL FIELD

The present disclosure relates to transistor outline (TO) packages. More particularly, the present disclosure relates to a coefficient of thermal expansion (CTE) matched TO header for a TO package.

BACKGROUND

Transistor outline (TO) packages include a TO header and a TO cap. Optical components, such as a laser diode, may be mechanically coupled to the TO header. For example, a laser diode may be included in a chip on sub-mount assembly that is attached to the TO header. The TO header may include a header base and a header stem. For example, the chip on sub-mount assembly, which includes the laser diode, is attached to the header stem of the TO header, and the header stem is attached to the header base of the TO header. The TO cap may support a window or lens to permit the laser diode mounted to the TO header to be optically coupled to another optical component disposed external to the TO package or an optical fiber. The TO cap may be affixed to a header base of the TO header using a welding procedure, thereby providing a hermetic seal for optical components mounted to the header stem and aligning a lens or window to a centerline of the TO package and to the optical components mounted to the header stem.

Copper may be selected for the header stem to provide a low thermal resistance for the TO package, thereby permitting heat to be removed from the TO package during operation of the optical components, such as the laser diode. Steel may be selected for the header base to permit the TO cap to be welded to the header base to form the hermetic seal. However, a coefficient of thermal expansion (CTE) mismatch between the steel header base and the copper header stem results in thermal stress. The thermal stress distorts the copper header stem from a centerline of the TO package at a change of temperature of the TO package from an ambient temperature to an operating temperature. Accordingly, it may be desirable for a thermally dissipating TO package to include a CTE matched header stem, such as a copper-tungsten header stem, and header base to maintain an alignment and optical coupling of optical components inside the TO package to corresponding optical components external to the TO package at an operating temperature of the optical components inside the TO package.

SUMMARY

According to some possible implementations, a transistor outline (TO) header may include a copper-tungsten header stem with a first coefficient of thermal expansion (CTE) value. The TO header may include a header base with a second CTE value that is different than the first CTE value. The header base may be a different material from the copper-tungsten header stem.

According to some possible implementations, an optical module may include a laser diode. The optical module may include a transistor outline (TO) cap. The optical module may include a TO header. The TO header may include a header base to attach to the TO cap. The TO header may include a copper-tungsten header stem to attach to the header base and to mount the laser diode.

According to some possible implementations, a transistor outline (TO) package may include a TO cap. The TO package may include a TO header. The TO header may include a header stem of a first material and a first coefficient of thermal expansion (CTE) value. The TO header may include a header base of a second material and a second CTE value. The first material and the second material may be different. The first CTE value and the second CTE value may be different. The first CTE value and the second CTE value may be within a threshold percentage of each other.

DETAILED DESCRIPTION

The following detailed description of example implementations refers to the accompanying drawings. The same reference numbers in different drawings may identify the same or similar elements.

A laser diode provides laser light to an optical communications transmitter or an optical communications transceiver to enable optical communication. The laser diode may be included in a chip on sub-mount assembly. The chip on sub-mount assembly may affix the laser diode to a sub-mount substrate or incorporate the laser diode into the sub-mount substrate, and may provide a heat spreading functionality for the laser diode. The chip on sub-mount assembly is attached to an optical module, such as a transistor outline (TO) package.

The TO package may include a TO header and a TO cap. The TO header may include a header base and a header stem. The chip on sub-mount assembly is attached to the header stem to align the laser diode with a centerline of the TO package, and optically couple the laser diode with one or more optical components of the optical communications transmitter or optical communications transceiver that are external to the TO package. Thus, it may be advantageous to ensure that the laser diode remains in alignment with the centerline of the TO package and is provided a threshold amount of heat dissipation by the TO package.

Steel may be selected for the header base to ensure that the TO cap can be welded to the header base to provide a hermetic seal of the laser diode and to align a window or lens of the TO cap with the laser diode. Copper may be selected for the header stem to ensure a low thermal resistance, thereby providing the threshold amount of heat dissipation. However, the copper header stem is relatively soft, and distorts away from a first position at an ambient temperature to a second position at an operating temperature of the laser diode. Moreover, a coefficient of thermal expansion (CTE) mismatch between the copper header stem and the steel header base forestalls compensation of the distortion via thermal expansion or thermal contraction, thus it may be advantageous to CTE match the header stem and the header base.

Implementations, described herein, may provide a copper-tungsten based header stem for a TO package, thereby reducing a temperature-induced coupling change without negatively impacting electrical performance of the TO package. Based on reducing the temperature-induced coupling change, the copper-tungsten based header stem improves coupling efficiency of the laser diode for the optical communications transmitter or the optical communications transceiver, thereby improving optical communications system performance.

Figure 1A:
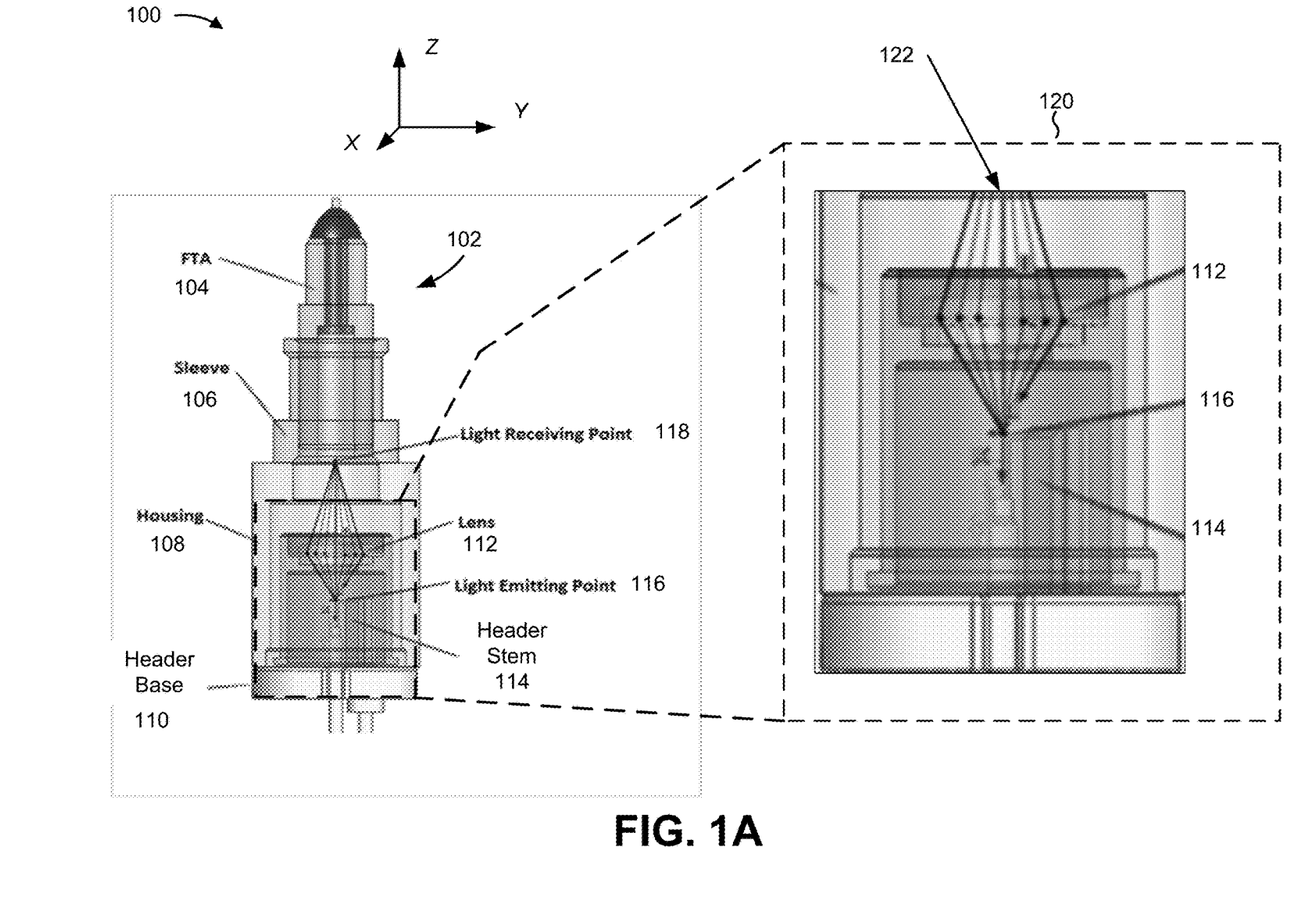
FIGS. 1A and 1B are diagrams of an overview of an example implementation described herein.
Figure 1B:
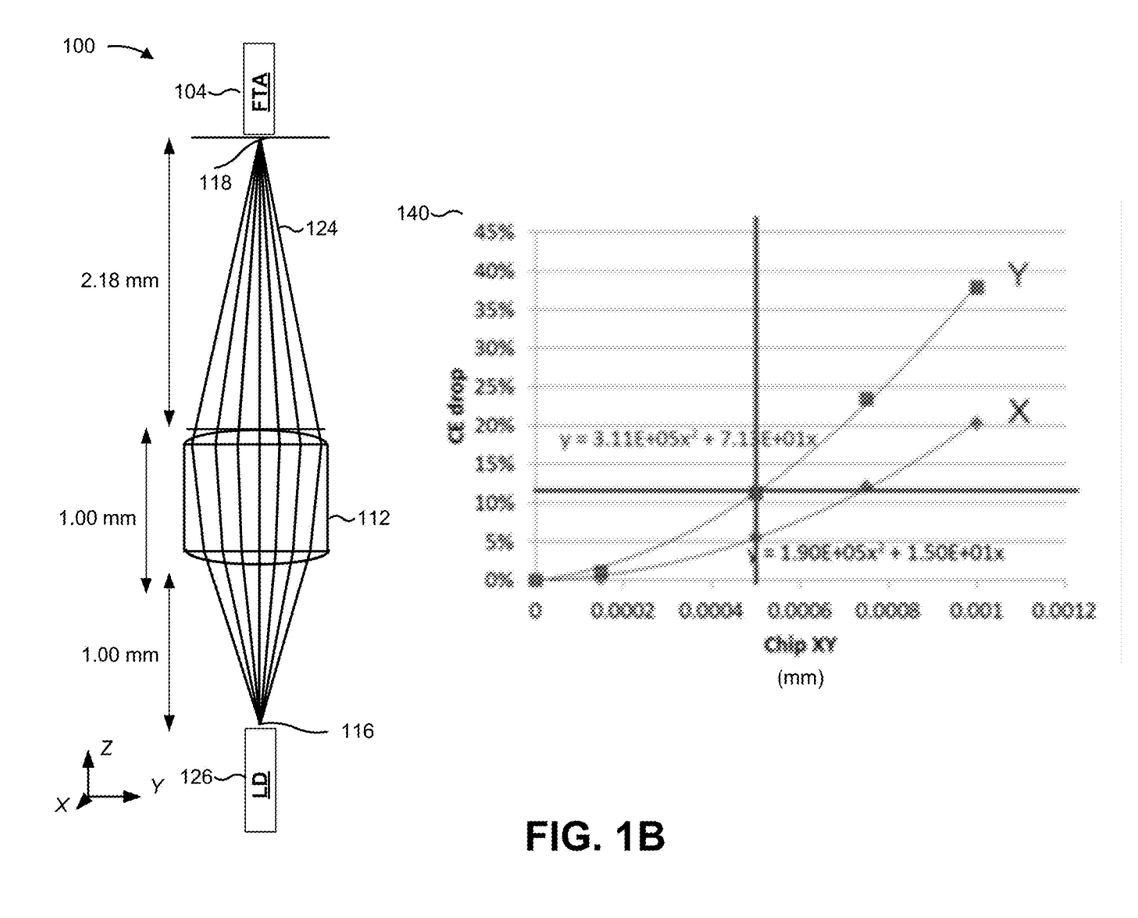

FIGS. 1A and 1B are an overview of an example implementation 100. FIG. 1A shows an overview of a pump laser assembly that includes a TO package. As shown in FIG. 1A, example implementation 100 includes a pump laser assembly 102, which includes a fiber tail assembly (FTA) 104, a sleeve 106, a housing 108, a header base 110 of the TO package, a lens 112, and a header stem 114 of the TO package.

Pump laser assembly 102 includes a laser diode that emits a laser beam for an optical communications transmitter or an optical communications transceiver of an optical communications system. In some implementations, pump laser assembly 102 may operate at a particular temperature range. For example, pump laser assembly 102 may operate at an operating temperature of between approximately 0 degrees Celsius (C.) and approximately 75 degrees C. Pump laser assembly 102 includes a set of components, such as FTA 104, sleeve 106, and/or housing 108, to optically couple the laser diode with an optical fiber, another optical component, and/or the like. Pump laser assembly 102 mounts lens 112, which focuses a laser beam emitted from the laser diode at light emitting point 116 toward light receiving point 118, as shown in detail with regard to call-out diagram 120.

Header base 110 is a TO header base of a TO header. Header base 110 may be attached to header stem 114. Header stem 114 is a TO header stem of the TO header. The laser diode is mounted onto header stem 114. Header base 110 may attach to a TO cap, which may provide a hermetic seal of the laser diode mounted onto header stem 114. Header base 110 and header stem 114 are positioned to align the laser diode to centerline 122 of pump laser assembly 102 to ensure that the laser diode is optically coupled to an optical fiber, another optical component, and/or the like.

Pump laser assembly 102 is associated with a particular coupling efficiency of the laser diode, which may be temperature dependent. A temperature-induced coupling change (TCC) relating to the coupling efficiency is determined as:

$$TCC_{Tcase}=(P_{Tcase}/P_{ref})-1;$$

where $TCC_{Tcase}$ is a temperature-induced coupling change at an operating temperature of pump laser assembly 102, $P_{Tcase}$ is an output power of pump laser assembly 102 at the operating temperature, and $P_{ref}$ is an output power of pump laser assembly 102 at a reference temperature or ambient temperature (e.g., 25 degrees C.). Based on a temperature change, a position of light emitting point 116 (e.g., a position of a laser diode mounted header stem 114) is altered as a result of thermal distortion.

In this case, using a coefficient of thermal expansion (CTE) matched design results in a reduced thermal distortion of the laser diode from centerline 122 at an operating temperature of pump laser assembly 102, thereby causing a reduced TCC for pump laser assembly 102 relative to another design. For example, header base 110 may be manufactured from steel to enable welding of a TO cap to header base 110 and header stem 114 may be manufactured from a copper (Cu)-tungsten (W) based material, such as a CuW50 material, a CuW60 material, a CuW70 material, and/or the like. In this case, the CTE match may be within a threshold percentage, such as within approximately 25%, within approximately 20%, within approximately 15%, within approximately 10%, and/or the like. Further to the example, the copper-tungsten based material ensures a threshold amount of heat dissipation for the laser diode, thereby reducing a likelihood of the laser diode overheating relative to another material.

As shown in FIG. 1B, during operation of pump laser assembly 102, a laser beam is directed, via lens 112, from laser diode (LD) 126 at light emitting point 116 toward light receiving point 118 and toward FTA 104. Laser diode 126 may be disposed away from lens 112 by a distance along an optical axis of, for example, approximately 1.00 millimeters (mm). Lens 112 may be associated with a length along the optical axis of, for example, approximately 1.00 mm. Lens 112 may be disposed away from light receiving point 118 along the optical axis by, for example, approximately 2.18 mm.

As further shown in FIG. 1B, chart 140 shows an example of optical performance of another pump laser based on an offset of a laser diode of the other pump laser (Chip XY). For example, with regard to thermal distortion causing displacement of the laser diode of the other pump laser in the X axis, a distortion of 0.0005 mm results in a 5% reduction in coupling efficiency (CE drop). Similarly, with regard to thermal distortion causing displacement of the laser diode of the other pump laser in the Y axis, a distortion of 0.0005 mm results in a 10% reduction in coupling efficiency. Accordingly, reduction in thermal distortion in the X axis and more particularly in the Y axis of pump laser assembly 102, relative to the other pump laser, results in improved coupling efficiency (i.e., a reduced coupling efficiency reduction) for pump laser assembly 102.

In another example, a similar CTE matched TO package may improve performance of a non-fiber coupled laser package, such as a transmit optical sub-assembly (TOSA) package and/or the like.

As indicated above, FIGS. 1A and 1B are provided merely as an example. Other examples are possible and may differ from what was described with regard to FIGS. 1A and 1B.

Figure 2A:
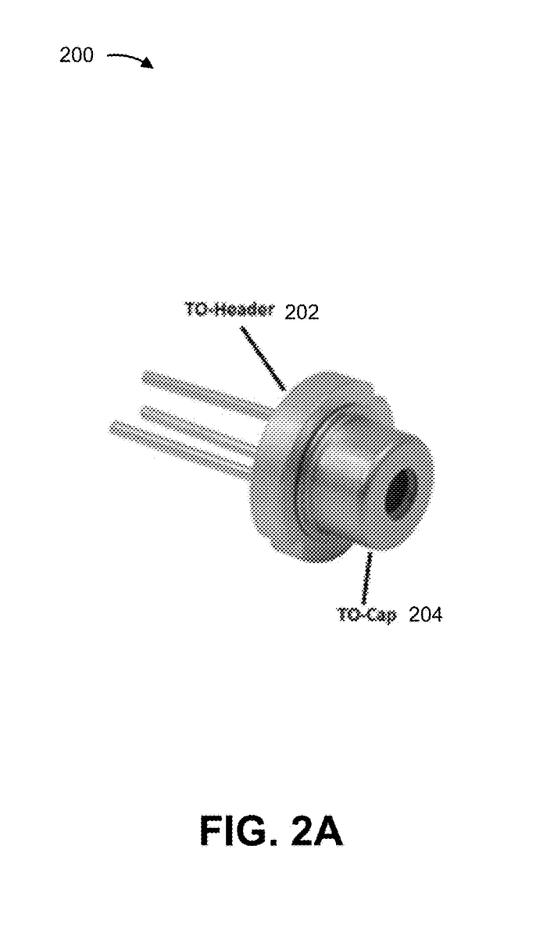
FIGS. 2A and 2B are diagrams of an example implementation of a CTE matched TO package.
Figure 2B:
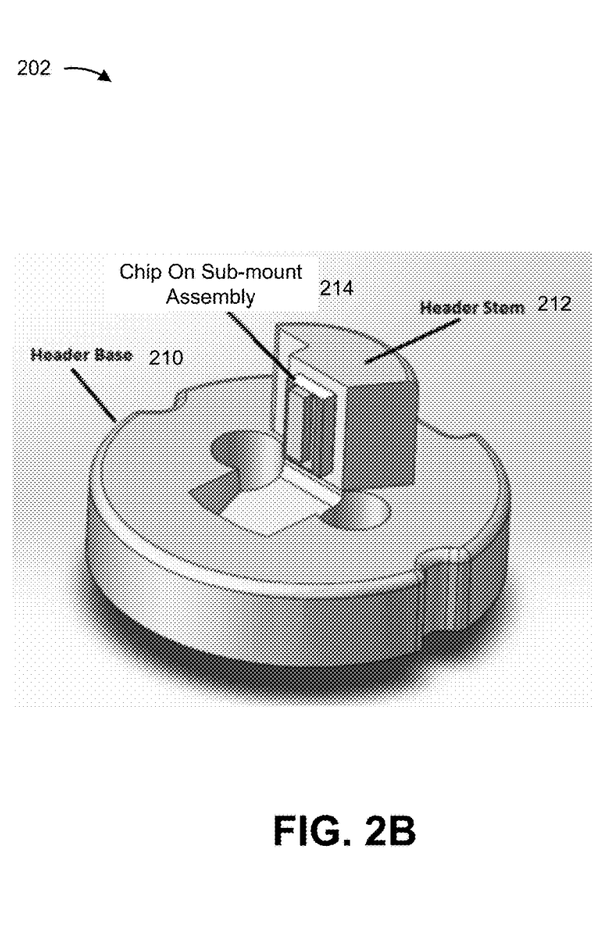

FIGS. 2A and 2B are diagrams of an example implementation 200. FIGS. 2A and 2B show an example of a CTE matched TO package.

As shown in FIG. 2A, a TO package includes a TO header 202 and a TO cap 204. TO cap 204 may be attached to TO header 202 to provide a hermetic seal for a laser diode mounted to TO header 202. TO header 202 and TO cap 204 may be manufactured using a copper-tungsten based material, such as CuW50 or the like, a steel based material, a combination of a copper-tungsten based material and a steel based material, and/or the like. In another example, TO header 202 and TO cap 204 may be manufactured using a copper-molybdenum based material, such as a CuMo60 material. In some implementations, the material from which TO header 202 and TO cap 204 are manufactured may be selected to permit TO cap 204 to be attached to TO header 202, such as by a welding process. TO cap 204 may include an opening, which may mount a lens, a glass, a filter, or the like to permit a laser diode mounted to TO header 202 to optically couple to another optical component, an optical fiber, and/or the like.

As shown in FIG. 2B, TO header 202 includes a header base 210, a header stem 212, and a chip on sub-mount assembly 214. Header base 210 may receive TO cap 204, when TO cap 204 is to be attached to TO header 202. For example, TO cap 204 may be welded to header base 210. Header stem 212 may provide mechanical support for chip on sub-mount assembly 214 and thermal dissipation. For example, chip on sub-mount assembly 214 may be attached to header stem 212.

Header base 210 and header stem 212 may be manufactured using a copper-tungsten based material, such as a CuW50; a copper-molybdenum based material, such as CuMo60; and/or the like. In this way, header base 210 and header stem 212 may be CTE matched to reduce a thermal distortion of header stem 212 and/or to permit compensation of thermal distortion of header stem 212. In some implementations, chip on sub-mount assembly 214 may be aligned to a centerline of the TO package when attached to header stem 212. The centerline of the TO package is an output optical axis of the TO package. Additionally, or alternatively, chip on sub-mount assembly 214 may be aligned to within a threshold amount offset from the centerline of the TO package, such that at an operating temperature of the TO package, distortion of header stem 212 and thermal expansion or compression of header base 210 cause chip on sub-mount assembly 214 and a laser diode thereof to be aligned to the centerline of the TO package. Based on a CTE match of header stem 212 and header base 210, alignment of chip on sub-mount assembly 214 at a reference temperature may be selected such that distortion of header stem 212 is compensated for by thermal expansion or contraction of header base 210. In this way, a CTE matched TO package may be used to ensure that the laser diode is aligned to the centerline of the TO package during operation of the laser diode, thereby improving coupling efficiency relative to a non-CTE matched TO package.

As indicated above, FIGS. 2A and 2B are provided merely as an example. Other examples are possible and may differ from what was described with regard to FIGS. 2A and 2B.

Figure 3A:
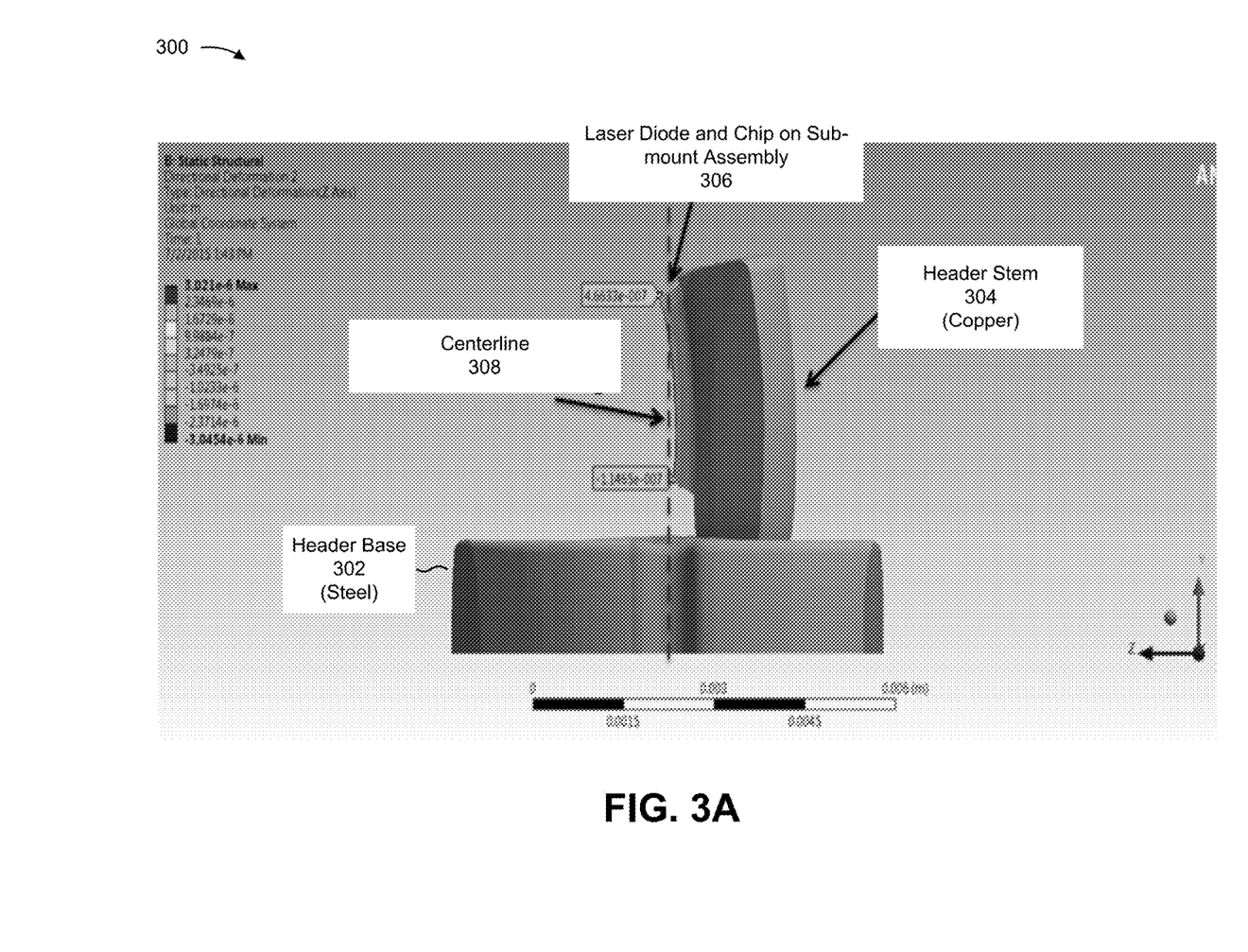
FIGS. 3A and 3B are diagrams of a finite element analysis relating to the example implementations described herein.
Figure 3B:
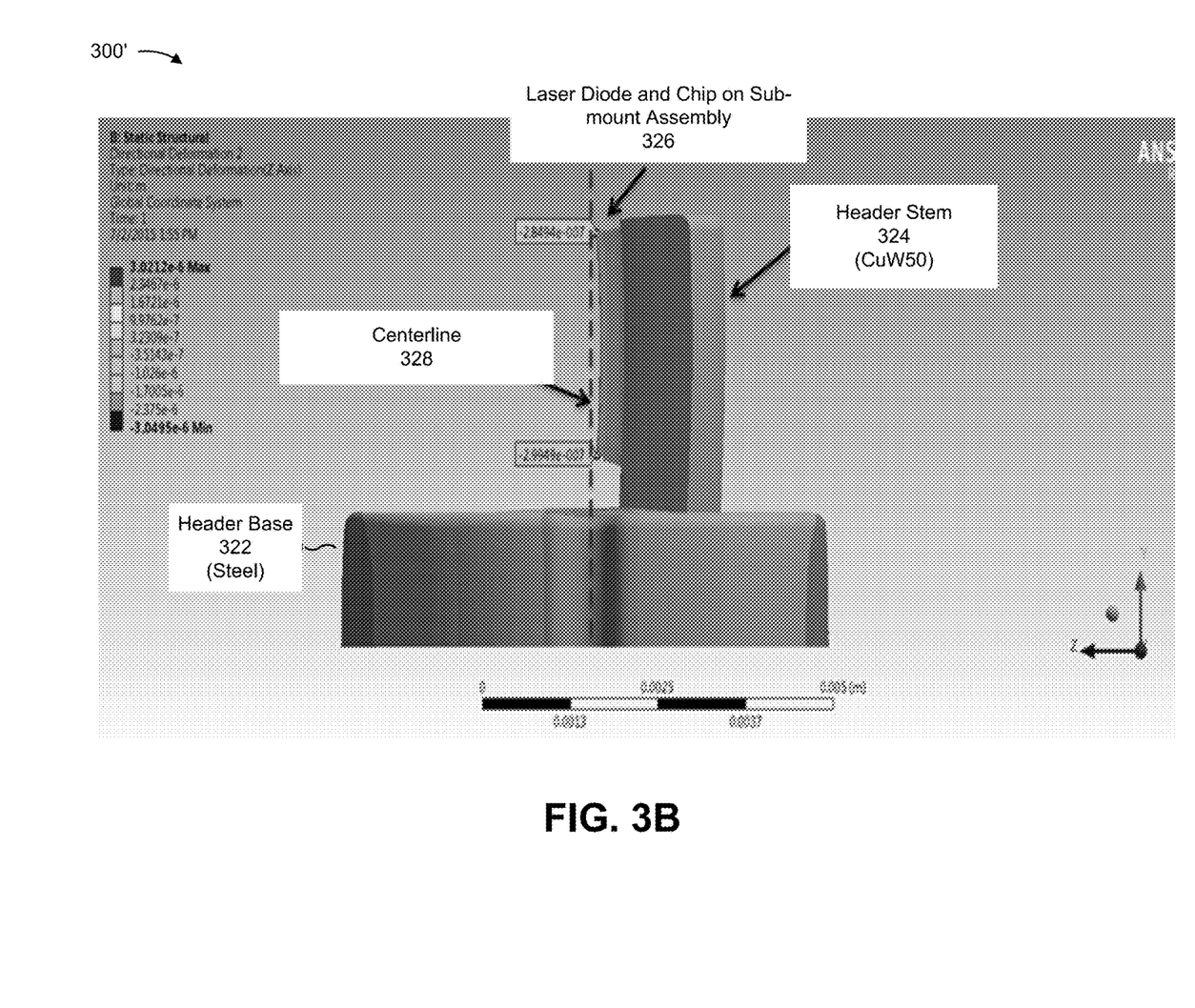

FIGS. 3A and 3B are diagrams of a finite element analysis 300/300' relating to example implementations described herein. FIGS. 3A and 3B show an example of a finite element analysis of a non-CTE matched TO header and a CTE matched TO header, respectively.

As shown in FIG. 3A, a non-CTE matched TO header includes header base 302, header stem 304, and a laser diode and chip on sub-mount assembly 306. In this case, header base 302 is manufactured from a steel based material with a first CTE value and header stem 304 is manufactured from a copper based material with a second CTE value. As a result of a difference between the first CTE value and the second CTE value, at an operating temperature of laser diode and chip on sub-mount assembly 306, header stem 304 is thermally deformed, as shown, causing the laser diode and chip on sub-mount assembly 306 to deviate from centerline 308 of the non-CTE matched TO header. As a result, coupling efficiency is reduced causing degraded performance for an optical communications transmitter or optical communications transceiver that includes the non-CTE matched TO header.

As shown in FIG. 3B, a CTE matched TO header includes header base 322, a header stem 324, and a laser diode and chip on sub-mount assembly 326. In this case, header base 322 is manufactured using a steel based material and header stem 324 is manufactured using a Copper Tungsten based material (e.g. CuW50, CuW70) resulting in a CTE match between header base 322 and header stem 324. CuW50 may be selected for header stem 324 to achieve a threshold CTE match with the steel of header base 322, and to achieve a relatively low thermal resistance for the TO header, which may enable a threshold level of chip and/or package reliability. In this case, CuW50 may be associated with a 260 W/m-C thermal conductivity value, thereby achieving the relatively low thermal resistance and permitting the CTE match.

As a result of the CTE match, at an operating temperature, header stem 324 is thermally deformed, as shown, by a reduced amount relative to header stem 304. As a result, laser diode and chip on sub-mount assembly 326 deviate from centerline 328 by a reduced amount relative to the deviation of laser diode and chip on sub-mount assembly 306 from centerline 308. Based on the reduced deviation of laser diode and chip on sub-mount assembly 326 from centerline 328, a coupling efficiency is improved (i.e., a reduction in coupling efficiency is reduced) for an optical communications transmitter or optical communications transceiver that includes the CTE matched TO header.

As indicated above, FIGS. 3A and 3B are provided merely as examples. Other examples are possible and may differ from what was described with regard to FIGS. 3A and 3B.

Figure 4:
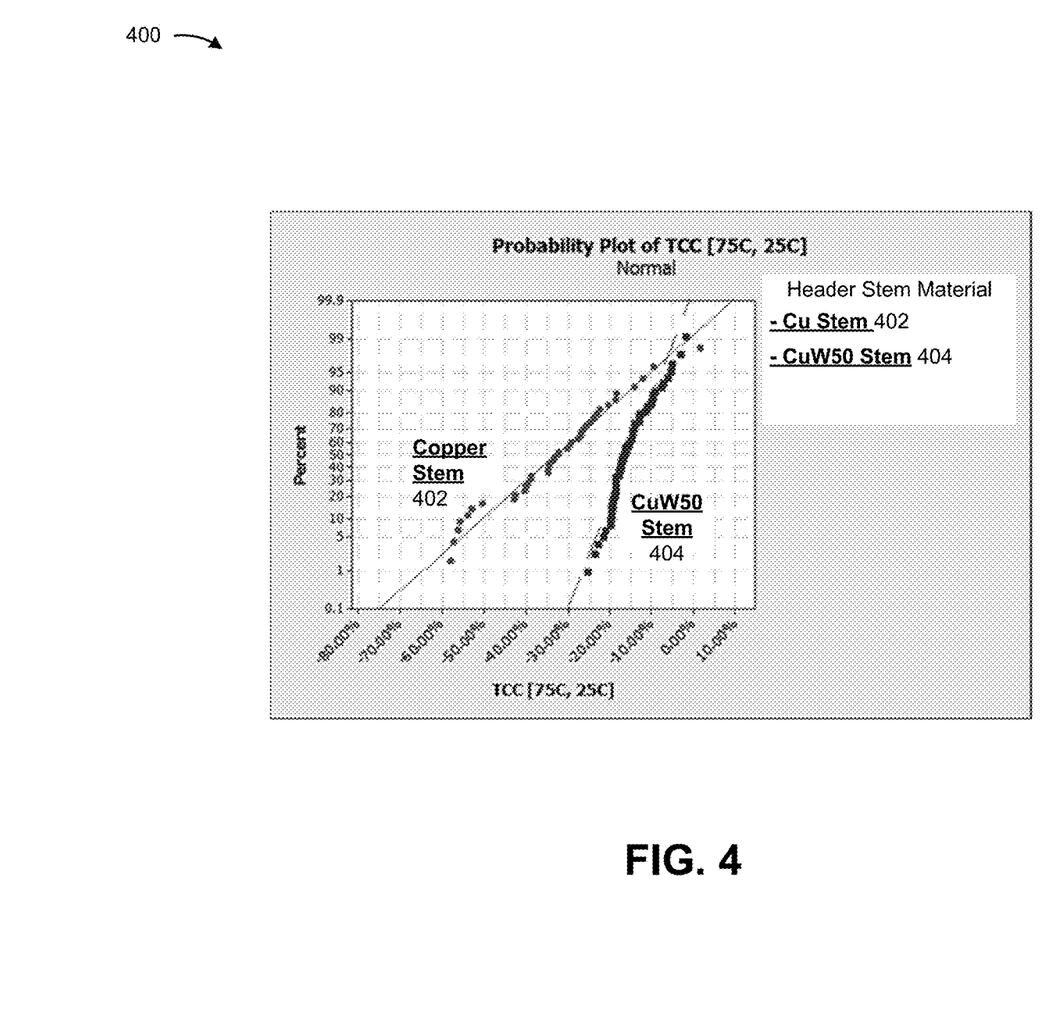
FIG. 4 is a diagram of a temperature-induced coupling change relating to the example implementations described herein.

FIG. 4 is a diagram of example results of determining a temperature-induced coupling change (TCC) for a set of header stem materials. As shown in FIG. 4, a probability plot 400 is determined for a temperature-induced coupling change at an operating temperature of 75 degrees C. relative to a reference temperature or ambient temperature of 25 degrees C. As shown by reference number 402, a first header stem is manufactured from a copper (Cu) based material. As shown by reference number 404, a second header stem is manufactured from a copper-tungsten (CuW50) based material. Assume that each header stem is attached to a steel header base. In this case, as shown in probability plot 400, use of copper stem 402 results in a greater temperature-induced coupling change for a laser diode attached to copper stem 402 relative to a laser diode attached to CuW50 stem 404. In this way, use of CuW50 or another similarly CTE matched material for a header stem improves optical performance of a laser diode mounted to the CTE-matched header stem relative to a non-CTE matched header stem.

As indicated above, FIG. 4 is provided merely as an example. Other examples are possible and may differ from what was described with regard to FIG. 4.

In this way, a CTE matched header stem, such as a copper-tungsten (e.g., CuW50, CuW60, CuW70, etc.) header stem, in a TO package results in improved optical performance for a laser diode mounted to the CTE matched header stem relative to a non-CTE matched header stem without reducing thermal dissipation functionality of the header stem.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A transistor outline (TO) header for coupling to a TO cap, comprising:
   a copper-tungsten header stem with a first coefficient of thermal expansion (CTE) value; and
   a header base with a second CTE value that is different than the first CTE value,
      the header base being a different material from the copper-tungsten header stem.

2. The TO header of claim 1, where the TO header and the TO cap form a TO package.

3. The TO header of claim 1, where the first CTE value is within a threshold percentage of the second CTE value.

4. The TO header of claim 1, where the header base is a steel header base.

5. The TO header of claim 1, where the copper-tungsten header stem is aligned with an output optical axis of the TO header at an operating temperature of the TO header.

6. The TO header of claim 5, where the copper-tungsten header stem is aligned with the output optical axis within a threshold amount.

7. The TO header of claim 5, where the copper-tungsten header stem is to receive a chip on sub-mount assembly such that a laser diode is aligned to the output optical axis of the TO header.

8. An optical module, comprising:
   a laser diode;
   a transistor outline (TO) cap; and
   a TO header,
      the TO header comprising:
         a header base to attach to the TO cap, and
         a copper-tungsten header stem to attach to the header base and to mount the laser diode.

9. The optical module of claim 8, where the copper-tungsten header stem is offset from a centerline of the optical module at a reference temperature such that, at an operating temperature of the optical module, the copper-tungsten header stem is aligned to the centerline of the optical module.

10. The optical module of claim 9, where the operating temperature is between approximately 0 degrees Celsius and approximately 75 degrees Celsius.

11. The optical module of claim 9, where the reference temperature is approximately 25 degrees Celsius.

12. The optical module of claim 8, where the TO cap is welded to the header base.

13. The optical module of claim 8, where the header base is steel.

14. The optical module of claim 8, where the copper-tungsten header stem includes at least one of:
   a CuW50 material,
   a CuW60 material, or
   a CuW70 material.

15. A transistor outline (TO) package, comprising:
   a TO cap; and
   a TO header comprising:
      a header stem of a first material and a first coefficient of thermal expansion (CTE) value, and
      a header base of a second material and a second CTE value,
         the first material and the second material being different,
         the first CTE value and the second CTE value being different,
         the first CTE value and the second CTE value being within a threshold percentage of each other.

16. The TO package of claim 15, where the threshold percentage is approximately 20%.

17. The TO package of claim 15, where the first material includes at least one of:
   a copper-tungsten based material, or
   a copper-molybdenum based material.

18. The TO package of claim 15, where the header stem is to receive an optical component.

19. The TO package of claim 18, where the optical component is a laser diode.

20. The TO package of claim 18, where the TO cap includes a lens to optically couple the optical component to an optical fiber.

* * * * *